US009759762B2

United States Patent
Shinohara et al.

(10) Patent No.: US 9,759,762 B2
(45) Date of Patent: Sep. 12, 2017

(54) PROBE DEVICE

(71) Applicant: Tokyo Electron Limited, Tokyo (JP)

(72) Inventors: Eiichi Shinohara, Yamanashi (JP); Munetoshi Nagasaka, Yamanashi (JP); Ken Taoka, Yamanashi (JP); Yoshiyasu Kato, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/781,021

(22) PCT Filed: Mar. 18, 2014

(86) PCT No.: PCT/JP2014/058150
§ 371 (c)(1),
(2) Date: Sep. 28, 2015

(87) PCT Pub. No.: WO2014/157121
PCT Pub. Date: Oct. 2, 2014

(65) Prior Publication Data
US 2016/0061882 A1 Mar. 3, 2016

(30) Foreign Application Priority Data
Mar. 28, 2013 (JP) ................................ 2013-067811

(51) Int. Cl.
*G01R 1/07* (2006.01)
*G01R 31/26* (2014.01)
(Continued)

(52) U.S. Cl.
CPC ......... *G01R 31/26* (2013.01); *G01R 1/07314* (2013.01); *G01R 31/2887* (2013.01);
(Continued)

(58) Field of Classification Search
CPC .................................................. G01R 1/07342
(Continued)

(56) References Cited

U.S. PATENT DOCUMENTS

| | | | | |
|---|---|---|---|---|
| 4,052,793 A | * | 10/1977 | Coughlin | G05D 3/00 324/537 |
| 4,266,185 A | * | 5/1981 | Charlesworth | G01R 27/14 324/716 |

(Continued)

FOREIGN PATENT DOCUMENTS

| EP | 2546668 A1 | 1/2003 |
|---|---|---|
| JP | 2011-138865 | 7/2011 |

(Continued)

OTHER PUBLICATIONS

International Search Report, PCT/JP2014/058150, May 27, 2014, 1 page.*

(Continued)

*Primary Examiner* — Clayton E Laballe
*Assistant Examiner* — Kevin Butler

(57) ABSTRACT

A probe device includes an electrode plate arranged above a mounting table for mounting thereon a semiconductor wafer and electrically connected to a tester, a contact probe arranged at a side of the mounting table and electrically connected to a mounting table electrode of the mounting table. The contact probe includes a contact portion, having a top surface formed uneven, to be in contact with the electrode plate, and a cable connection portion formed as one unit with the contact portion. The contact portion and the cable connection portion are vertically movable by a biasing member provided below the cable connection portion. When the probes are made contact with electrodes of a semiconductor device of the semiconductor wafer by moving up the mounting table, the contact portion and the electrode plate (Continued)

are made contact with each other and the backside electrode and the tester are electrically connected to each other.

14 Claims, 3 Drawing Sheets

(51) Int. Cl.
    *G01R 1/073*     (2006.01)
    *G01R 3/00*     (2006.01)
    *G01R 31/28*     (2006.01)

(52) U.S. Cl.
    CPC ...... *G01R 1/07342* (2013.01); *G01R 1/07378* (2013.01); *G01R 3/00* (2013.01); *G01R 31/2886* (2013.01)

(58) Field of Classification Search
    USPC .................................................. 324/756.03
    See application file for complete search history.

(56) References Cited

U.S. PATENT DOCUMENTS

| | | | | |
|---|---|---|---|---|
| 8,120,375 B2* | 2/2012 | Foster | ................ | G01R 1/07314 324/756.03 |
| 8,134,381 B2* | 3/2012 | Abe | ................ | G01R 31/2886 324/754.07 |
| 8,432,176 B2* | 4/2013 | Gunji | ................ | G01R 31/2875 324/750.03 |
| 8,525,538 B2* | 9/2013 | Kim | ................ | G01R 31/2887 324/754.11 |
| 9,110,131 B2* | 8/2015 | Dietrich | ............. | G01R 31/2891 |
| 9,176,185 B2* | 11/2015 | Canegallo | .......... | G01R 31/2889 |
| 9,347,970 B2* | 5/2016 | Shinohara | ............ | G01R 1/0491 |
| 2002/0089343 A1* | 7/2002 | Khoury | ............. | G01R 1/06711 324/755.05 |
| 2003/0122567 A1* | 7/2003 | Miller | ................ | G01R 31/2875 324/750.08 |
| 2004/0113640 A1* | 6/2004 | Cooper | ................... | G01R 3/00 324/750.25 |
| 2004/0145386 A1* | 7/2004 | Byun | ................. | G01R 31/2886 324/754.19 |
| 2008/0290882 A1* | 11/2008 | Rogers | .................... | G01R 1/36 324/755.11 |
| 2009/0273357 A1* | 11/2009 | Kamata | .............. | G01R 1/06727 324/754.03 |
| 2010/0026331 A1* | 2/2010 | Chong | ............... | G01R 1/07342 324/754.03 |
| 2010/0039130 A1* | 2/2010 | Kumagai | ................ | H01L 22/12 324/754.03 |
| 2011/0316576 A1* | 12/2011 | Kataoka | ............. | G01R 31/2891 324/756.03 |
| 2012/0068728 A1* | 3/2012 | Kataoka | ............. | G01R 31/3025 324/756.03 |
| 2012/0194213 A1* | 8/2012 | Komatsu | ........... | G01R 31/2887 324/756.03 |
| 2012/0242363 A1* | 9/2012 | Breinlinger | ........ | G01R 1/06716 324/756.02 |
| 2013/0063171 A1* | 3/2013 | Kouno | ............... | G01R 31/2886 324/750.25 |
| 2014/0203834 A1* | 7/2014 | Chang | ................ | G01R 1/07342 324/756.03 |
| 2015/0070038 A1* | 3/2015 | Joo | .................... | G01R 1/07378 324/754.07 |

FOREIGN PATENT DOCUMENTS

| | | | | |
|---|---|---|---|---|
| JP | WO2011111834 | * | 9/2011 | ............ G01R 1/073 |
| KR | 10-2004-0013010 A | | 2/2004 | |
| KR | 10-2012-0128159 A | | 11/2012 | |
| WO | 2011-111834 | | 9/2011 | |
| WO | WO2013018910 | * | 2/2013 | ............... G01R 1/06 |

OTHER PUBLICATIONS

International Preliminary Report on Patentability, PCT/JP2014/058150, Mar. 28, 2013, 4 pages.*
The International Search Report.

* cited by examiner

PROBE DEVICE

CROSSREFERENCE

This application is a National Stage Application of, and claims priority to, PCT Application No. PCT/JP2014/058150, filed on Mar. 18, 2014, entitled "Probe Device," which claims priority to Japanese Patent Application No. 2013-067811, filed on Mar. 28, 2013. The foregoing patent applications are herein incorporated by reference by entirety for all purposes.

FIELD OF THE INVENTION

The present invention relates to a probe device.

BACKGROUND OF THE INVENTION

In a semiconductor device manufacturing process, a probe device is used to perform an electrical inspection of a semiconductor device formed on a semiconductor wafer. In the probe device, a semiconductor wafer is mounted on a mounting table (chuck top) and electrical conduction is obtained by driving the mounting table to bring probes into contact with electrodes of the semiconductor device of the semiconductor wafer. The test of the semiconductor device is performed by applying a predetermined test signal from a measuring device (tester) to the semiconductor device through the probes and detecting an output signal from the semiconductor device.

In a probe device for performing an electrical test of a semiconductor device having an electrode at the backside of the semiconductor wafer, e.g., a power device having a collector electrode formed at the backside of the semiconductor wafer, a conductive film electrode made of a conductive metal such as gold is formed as a mounting table electrode at a mounting surface of a mounting table (chuck top) and the conductive film electrode is made contact with the electrode formed at the backside of the semiconductor wafer, thereby obtaining electrical conduction. The power device has a high withstand voltage and a high current compared to a general semiconductor device and may have a high speed and a high frequency depending on purpose. An insulated-gate bipolar transistor (IGBT), a diode, a power transistor, a power MOSFET, a thyristor and the like may be used as the power device. The quality of the power device is determined by measuring its electrical characteristic (static characteristic and dynamic characteristic).

Further, in the probe device for performing the electrical test of the power device or the like, if the conductive film electrode and the tester are electrically connected by a cable or the like, the cable becomes longer due to the driving type of the mounting table and this leads to an increase of resistance or inductance of the cable. For this reason, there has been known a probe device having a configuration that pogo pins electrically connected to the conductive film electrode are provided at a side surface of the mounting table and the pogo pins are brought into contact with an annular electrode plate provided thereabove (see, e.g., Patent Document 1).

Patent Document 1: Japanese Patent Application Publication No-2011-138865

However, when the electrical test of the power device or the like is performed, a large current needs to flow and, thus, the electrical path in the probe device is increased. This increases the resistance or the inductance and leads to an increase of a load for the current of the electrical path. In addition, an output waveform obtained when a high frequency signal is applied becomes blunt. Accordingly, the accurate inspection cannot be performed. Therefore, it is preferable to reduce the electrical resistance or the like by minimizing the electrical path in the probe device.

SUMMARY OF THE INVENTION

In view of the above, the present invention provides a probe device capable of shortening an electrical path in the probe device compared to a conventional one to reduce an electrical resistance or the like and performing a test with high precision.

In accordance with an aspect, there is provided a probe device which is electrically connected to a semiconductor device formed on a semiconductor wafer and performs an electrical test of the semiconductor device by a tester, the probe device including: a mounting table configured to mount thereon the semiconductor wafer; a mounting table electrode formed on a mounting surface of the mounting table on which the semiconductor wafer is mounted, the mounting table electrode being into contact with a backside electrode formed on a backside of the semiconductor device; a probe card arranged above the mounting table, the probe card having a plurality of probes electrically connected with the tester; a driving mechanism configured to drive the mounting table to make the probes contact with electrodes of the semiconductor device of the semiconductor wafer mounted on the mounting table; an electrode plate arranged above the mounting table and electrically connected with the tester; a contact probe arranged at a side of the mounting table; a stopper and guide block fixed to the side of the mounting table; and a base block provided protruding from a lower portion of the mounting table, wherein the contact probe includes a contact portion, having a top surface formed uneven, to be into contact with the electrode plate, and a cable connection portion formed as one unit with the contact portion below the contact portion, a cable electrically connected to the mounting table electrode being connected to the cable connection portion, wherein the contact probe is locked to the base block through a probe guide block and a probe presser, wherein the contact probe is integrally formed from one metal material, wherein a gold-plated layer and an intermediate plated layer are formed on a surface of the contact probe, the intermediate plated layer being formed under the gold-plated layer, wherein the contact portion and the cable connection portion are configured to be vertically movable by a biasing member provided below the cable connection portion, and wherein when the probes are made contact with the electrodes of the semiconductor device by moving up the mounting table, the contact portion and the electrode plate are brought into contact with each other and the backside electrode and the tester are electrically connected to each other.

Effect of the Invention

According to the present invention, there is provided a probe device capable of shortening an electrical path in the probe device compared to a conventional one to reduce an electrical resistance or the like and performing a test with high precision.

DETAILED DESCRIPTION OF THE EMBODIMENTS

Hereinafter, embodiments of the present invention will be described with reference to the accompanying drawings.

Figure 1:
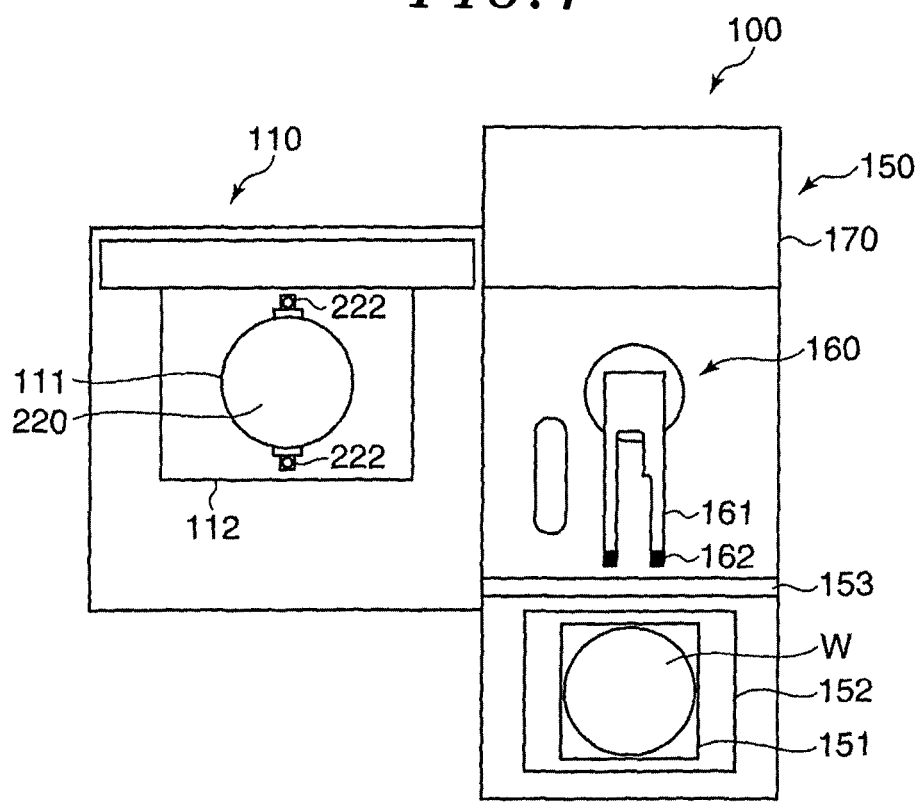
FIG. 1 is a plan view schematically showing an entire configuration of a probe device in accordance with an embodiment of the present invention.
Figure 2:
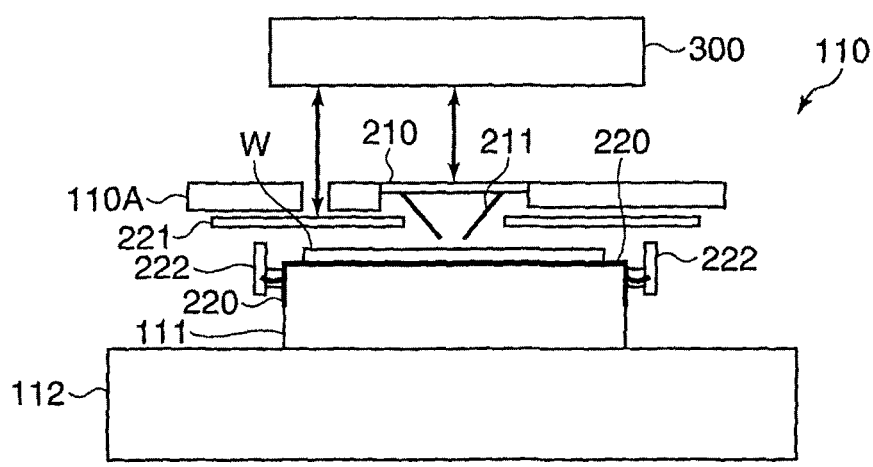
FIG. 2 is a side view schematically showing a configuration of a main part of the probe device shown in FIG. 1.

FIG. 1 is a plan view schematically showing an entire configuration of a probe device 100 in accordance with an embodiment of the present invention. FIG. 2 is a side view schematically showing a configuration of a main part of the probe device 100 of FIG. 1.

As shown in FIG. 1, the probe device 100 mainly includes a measuring unit 110 and a loader unit 150 serving as a transfer unit.

In the measuring unit 110, a mounting table 111 on which a semiconductor wafer W is mounted is provided to be movable in x-y-z-θ directions. Probes 211 (see FIG. 2) installed at a probe card 210 and electrodes of semiconductor devices formed on the semiconductor wafer W are made contact to each other by driving the mounting table 111 by using a driving mechanism 112, and electrical characteristics of the semiconductor devices are measured.

A load port 152 on which a wafer carrier (wafer cassette or FOUP) 151 accommodating the semiconductor wafer W is mounted is installed at the front side of the loader unit 150 (lower side in FIG. 1), and a wafer transfer mechanism 160 is installed adjacent to the load port 152. A position alignment mechanism 170 is installed at the rear side of the loader unit 150 (upper side in FIG. 1). The position alignment mechanism 170 detects a position of a notch of the semiconductor wafer W and an eccentric state of the semiconductor wafer W by rotating the semiconductor wafer W.

The wafer transfer mechanism 160 includes a wafer transfer arm 161 for vacuum-suctioning and transferring the semiconductor wafer W. The wafer transfer arm 161 includes a plurality of (two in this embodiment) suction portions (suction pad) 162 for vacuum-suctioning and holding the semiconductor wafer W. A vacuum line (not shown in FIG. 1) connected to a suction source such as a vacuum pump is connected to the suction portions 162. The wafer transfer arm 161 may be, if necessary, provided in plural number in a vertically overlapped state.

The wafer transfer mechanism 160 transfers the semiconductor wafer W between the wafer carrier 151 mounted on the load port 152, the position alignment mechanism 170, and the mounting table 111 of the measuring unit 110 by extending, retracting and rotating the wafer transfer arm 161.

The load port 152 is movable up and down by a vertical moving mechanism. A support frame 153 is provided between the load port 152 and the wafer transfer mechanism 160. An optical detector (not shown) is installed at the support frame 153. The optical detector detects presence or absence of the semiconductor wafer W while the wafer carrier 151 mounted on the load port 152 is moved up and down. Therefore, it is possible to detect a slot in the wafer carrier 151 which receives the semiconductor wafer W.

As shown in FIG. 2, the probe card 210 is disposed above the mounting table 111 and fixed to a head plate 110A arranged at an upper portion of the measuring unit 110 through a clamp mechanism (not shown). A plurality of probes 211 is installed at the probe card 210 and the probes 211 are electrically connected to a tester 300.

A conductive film electrode 220 (indicated by a bold line in FIG. 2), which is a mounting table electrode, made of conductive metal such as gold or the like is formed on the mounting surface of the mounting table 111 on which the semiconductor wafer W is mounted and on an upper portion of the side surface of the mounting table 111. The conductive film electrode 220 contacts with a backside electrode formed on the backside of the semiconductor device of the mounted semiconductor wafer W. A vacuum chuck (not shown) and a temperature control mechanism (not shown) are provided in the mounting table 111, so that the semiconductor wafer W mounted on the mounting table 111 can be sucked and held and can be controlled to a desired temperature.

An electrode plate 221 is provided between the probe card 210 and the mounting table 111. The electrode plate 221 is electrically connected to the tester 300. A plurality of (in this embodiment, total two at positions distanced by 180°) contact probes 222 is provided at the side of the mounting table 111. The contact probes 222 are electrically connected to the conductive film electrode 220. When the mounting table 111 is elevated, the contact probes 222 and the electrode plate 221 are made contact with each other and thus the conductive film electrode 220 and the tester 300 are electrically connected to each other. The electrode plate 221 has a shape that is contactable with the contact probes 222 at any positions when the probes 211 are made contact with the electrodes of the top surface of the semiconductor wafer W by driving the mounting table 111. For example, the electrode plate 221 may have a shape divided by two to allow the annular or two contact probes 222 to contact with the electrode plate 221.

Figure 3:
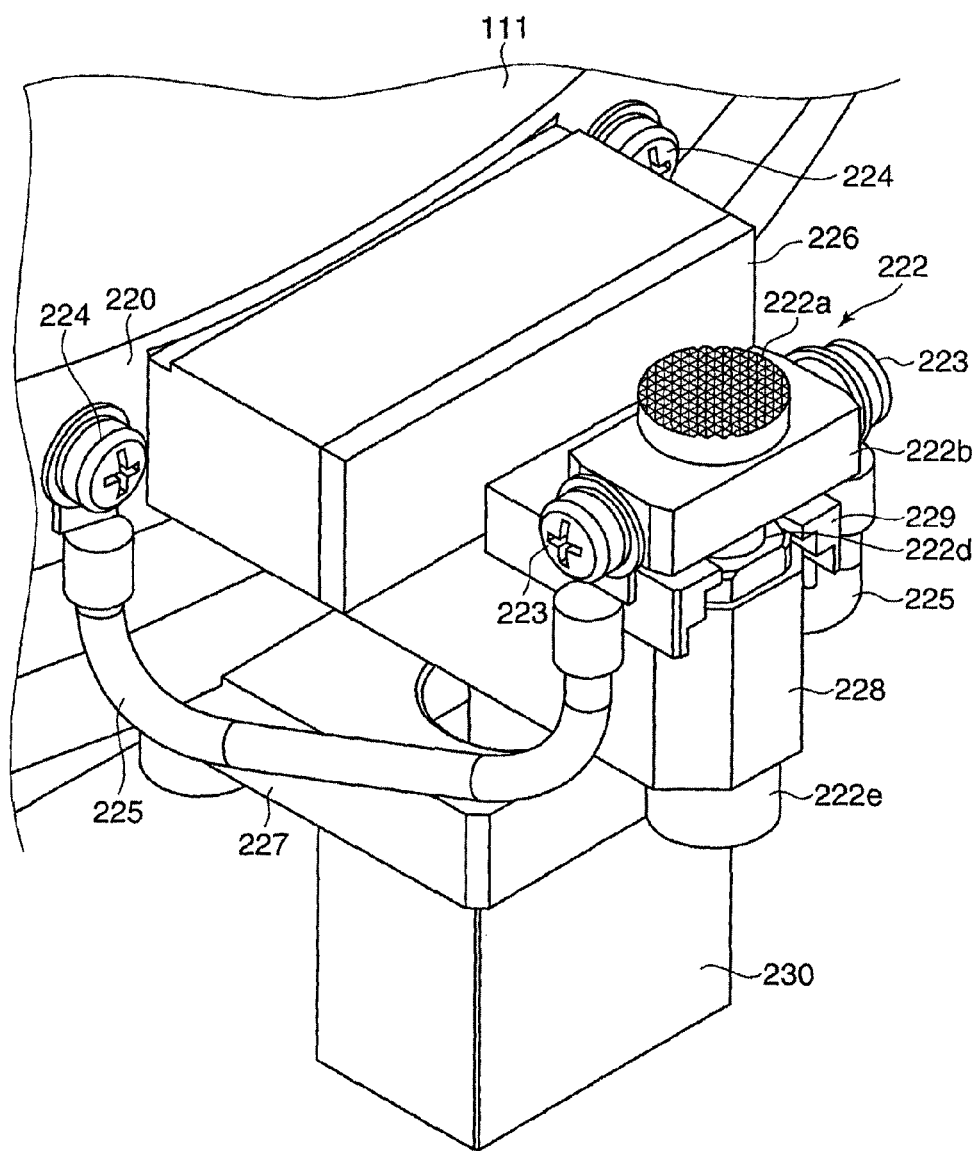
FIG. 3 is a perspective view schematically showing a configuration of a contact probe and its surroundings shown in FIG. 1.

As shown in FIG. 3, a disk-shaped contact portion 222a is provided at the apex of the contact probe 222. The top surface of the contact portion 222a is formed uneven. Below the contact portion 222a, a rectangular parallelepiped-shaped cable connection portion 222b is provided. The contact portion 222a and the cable connection portion 222b are formed integrally and made of metal such as brass or the like. That is, the contact portion 222a and the cable connection portion 222b are formed by cutting one metal material.

A gold-plated layer having a thickness of, e.g., about 0.3 μm to 0.5 μm is formed on the surface of the contact portion 222a and the cable connection portion 222b. An intermediate plated layer made of electroless nickel plating or the like having a thickness of, e.g., about 3 μm is formed under the gold-plated layer.

Figure 4:
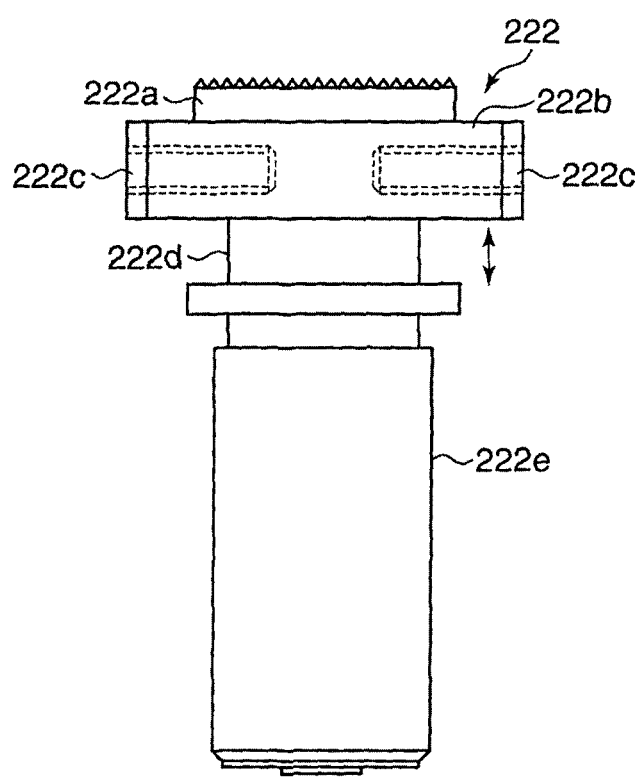
FIG. 4 is a side view schematically showing a configuration of the contact probe shown in FIG. 1.

As shown in FIG. 4, two screw holes 222c are formed so as to be positioned at opposite end portions in the lengthwise direction of the cable connection portion 222b at the side wall portions of the cable connection portion 222b. By screwing screws 223 (see FIG. 3) into the screw holes 222c and screws 224 into screw holes (not shown) formed at the conductive film electrode 220 of the mounting table 111, a conductor of a cable 225 is fixed by the screws 223 and 224 and thus the conductive film electrode 220 and the contact probe 222 are electrically connected to each other.

A cylindrical portion 222d is formed below the cable connection portion 222b. The cylindrical portion 222d is accommodated in a cylindrical member 222e. The contact portion 222a, the cable connection portion 222b and the like are biased toward the upper side with respect to the cylindrical member 222e by a biasing member (not shown) such as a coil spring provided in the cylindrical member 222e. As indicated by an arrow in FIG. 4, the contact portion 222a, the cable connection portion 222b and the like are movable in the vertical direction with respect to the cylindrical member 222e. Accordingly, the contact portion 222a contacts with the electrode plate 221 in an elastically pressed state.

As described above, in the probe device 100 of the present embodiment, the cable connection portion 222b is arranged just below the contact portion 222a of the contact probe 222. Further, the contact portion 222a and the cable connection portion 222b are integrally formed, and no sliding unit for making the contact portion 222a elastically contact with the electrode plate 221 is interposed between the contact portion 222a and the cable connection portion 222b. Furthermore, the gold-plated layer is formed on the surfaces of the contact portion 222a and the cable connection portion 222b.

Accordingly, the electrical path between the contact portion 222a and the cable connection portion 222b can be shortened, which suppresses the increase of the electrical resistance and the inductance. For example, the electrical resistance between the sidewall of the contact portion 222a and the sidewall of the cable connection portion 222b where the screw holes 222c are formed was 0.06 mΩ. On the other hand, in a configuration in which the contact portion and the cable connection portion are formed as separate members and a sliding member for allowing the contact portion to move is provided between the contact portion and the cable connection portion, the electrical resistance therebetween was 2.20 mΩ.

Further, the cable connection portion 222b and the conductive film electrode 220 are electrically connected to each other by the short cable 225 having low electric resistance, so that electric resistance between the conductive film electrode 220 and the tester 300 can be greatly reduced compared to a conventional case. Furthermore, since an electrical path from the conductive film electrode 220 to the contact portion 222a is short, inductance component can also be reduced. Therefore, in the case of measuring a reverse current of a diode, for example, it is possible to obtain a measurement result in which the bluntness of the waveform is smaller when the power device is not cut out from the wafer by using the probe device 100 of the present embodiment than when the power device is cut out from the wafer and packaged.

As shown in FIG. 3, a stopper and guide block 226 made of aluminum or the like is fixed to the side wall of the mounting table 111. A base block 227 made of stainless steel or the like is provided protruding from a lower portion of the mounting table 111. The contact probe 222 is locked to the base block 227 through a probe guide block 228 made of, e.g., resin such as PEEK (polyether ether ketone) or the like and a probe presser 229 made of, e.g., aluminum or the like.

An elevation mechanism 230 for moving the contact probe 222 up and down is provided below the base block 227. The elevation mechanism 230 moves the contact probe 222 up and down between an elevated position and a lowered position when the probes 211 have contacted with the electrodes of the top surface of the semiconductor wafer W by the elevation of the mounting table 111. At the elevated position, the contact portion 222a contacts with the electrode plate 221 and at the lowered position, the contact portion 222a does not contact with the electrode plate 221.

The elevation mechanism 230 can change a position in the vertical direction of the contact probe 222 in multi-steps between the elevated position and the lowered position. By doing so, a contact state between the contact portion 222a and the electrode plate 221 can be adjusted to an optimal state.

Next, a test sequence of the semiconductor wafer W by the probe device 100 will be described.

First, if the wafer carrier 151 accommodating the semiconductor wafers W is mounted on the load port 152 of the loader unit 150, the wafer carrier 151 is moved up and down by the vertical moving mechanism, and a slot accommodating the semiconductor wafer W is detected by the optical detector.

Next, the semiconductor wafer W is sucked and held by the wafer transfer arm 161 of the wafer transfer mechanism 160 and transferred to the position alignment mechanism 170. A position of the semiconductor wafer W is detected by detecting a notch of the semiconductor wafer W by the position alignment mechanism 170.

Next, the semiconductor wafer W of which the position has been detected by the position alignment mechanism 170 is taken from the position alignment mechanism 170 and mounted on the mounting table 111 of the measuring unit 110 by the wafer transfer arm 161 of the wafer transfer mechanism 160.

Then, the probes 211 are made contact with the semiconductor device of the semiconductor wafer W on the mounting table 111 to obtain electrical conduction between the tester 300 and the electrodes of the top surface of the semiconductor wafer W. Further, the contact portion 222a of the contact probe 222 is made contact with the electrode plate 221 to obtain electrical conduction between the tester 300 and the backside electrode of the semiconductor wafer W. In this state, a test signal is applied from the tester 300 to the semiconductor device, and an output signal from the semiconductor device is measured. By doing so, an electrical characteristic test of the semiconductor device is performed.

When the electrical characteristic test of the semiconductor device of the semiconductor wafer W is completed, the semiconductor wafer W is taken and accommodated in the wafer carrier 151 by the wafer transfer arm 161 of the wafer transfer mechanism 160. Then, the test of the semiconductor wafer W is completed.

As above, the present invention has been described with respect to the above embodiment, but the present invention is not limited to the above embodiment.

The present application claims priority based on Japanese Patent Application No. 2013-067811 filed on Mar. 28, 2013, the entire contents of which are incorporated herein by reference.

DESCRIPTION OF REFERENCE NUMERALS

W: semiconductor wafer
100: probe device
111: mounting table
210: probe card
211: probe
220: conductive film electrode
221: electrode plate
222: contact probe
222a: contact portion
222b: cable connection portion
225: cable

What is claimed is:
1. A probe device electrically coupled to a semiconductor device formed on a semiconductor wafer and configured to perform an electrical test of the semiconductor device by a tester, the probe device comprising:
a mounting table configured to mount the semiconductor wafer thereon;

a mounting table electrode formed on a mounting surface of the mounting table, wherein the semiconductor wafer is mounted on the mounting table, wherein the mounting table electrode contacts a backside electrode formed on a backside of the semiconductor device;

a probe card arranged above the mounting table, wherein the probe card comprises a plurality of probes electrically coupled with the tester;

a driving mechanism configured to drive the mounting table to cause the probes to contact with electrodes of the semiconductor device of the semiconductor wafer mounted on the mounting table;

an electrode plate arranged above the mounting table and electrically coupled with the tester;

a contact probe arranged at a side of the mounting table;

a stopper and guide block coupled to the side of the mounting table; and a base block protruding from a lower portion of the mounting table, wherein the contact probe includes: a contact portion configured to contact with the electrode plate, wherein the contact portion has a top surface formed uneven; and a cable connection portion formed as one unit with the contact portion and disposed below the contact portion; and a cable electrically coupled to the mounting table electrode being connected to the cable connection portion, wherein the contact probe is locked to the base block through a probe guide block and a probe presser, wherein the contact probe is integrally formed from one metal material, wherein a gold-plated layer and an intermediate plated layer are formed on a surface of the contact probe, the intermediate plated layer being formed under the gold-plated layer, wherein the contact portion and the cable connection portion are configured to be vertically movable by a biasing member that is disposed below the cable connection portion, and wherein, when the probes are made contact with the electrodes of the semiconductor device by moving up the mounting table, the contact portion and the electrode plate are brought into contact with each other and the backside electrode and the tester are electrically connected to each other.

2. The probe device of claim 1, wherein the contact probe is arranged in plural number at an interval along a circumferential direction of the mounting table.

3. The probe device of claim 1, further comprising an elevation unit configured to move the contact probe up and down.

4. The probe device of claim 3, wherein the elevation unit is configured to control a height of the contact probe at multiple stages.

5. The probe device of claim 1, wherein the contact portion has a disk shape,
wherein the cable connection portion has a rectangular parallelepiped shape,
wherein the cable connection portion is disposed immediately below the contact portion, and
wherein a screw part for connecting the cable is disposed at a side surface of the cable connection portion.

6. The probe device of claim 1, wherein a gold-plated layer is formed on a surface of the contact portion and a surface of the cable connection portion.

7. The probe device of claim 1, wherein a resistivity between a side surface of the contact portion and a side surface of the cable connection portion is smaller than or equal to 0.1 mΩ.

8. The probe device of claim 1, wherein the stopper and guide block is made of aluminum.

9. The probe device of claim 1, wherein the base block is made of stainless steel.

10. The probe device of claim 1, wherein the probe guide block is made of resin.

11. The probe device of claim 1, wherein the probe presser is made of aluminum.

12. The probe device of claim 1, wherein the intermediate plated layer is made of electroless nickel plating.

13. The probe device of claim 1, wherein the gold-plated layer has a thickness of 0.3 μm to 0.5 μm.

14. The probe device of claim 1, wherein the intermediate plated layer has a thickness of 3 μm.

* * * * *